US009419686B2

(12) United States Patent
Choi et al.

(10) Patent No.: US 9,419,686 B2
(45) Date of Patent: Aug. 16, 2016

(54) RECEIVER OF NFC DEVICE AND NFC DEVICE INCLUDING THE SAME

(71) Applicant: Samsung Electronics Co., Ltd, Suwon-si, Gyeonggi-do (KR)

(72) Inventors: Hang-Seok Choi, Seoul (KR); Il-Jong Song, Suwon-si (KR); Jun-Ho Kim, Seongnam-si (KR); Hyuk-Jun Sung, Seongnam-si (KR); Min-Woo Lee, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 102 days.

(21) Appl. No.: 14/450,408

(22) Filed: Aug. 4, 2014

(65) Prior Publication Data

US 2015/0094006 A1    Apr. 2, 2015

(30) Foreign Application Priority Data

Oct. 1, 2013  (KR) .......................... 10-2013-0117119

(51) Int. Cl.
*H04B 5/00* (2006.01)
*H04B 17/21* (2015.01)
*H03M 1/46* (2006.01)
(Continued)

(52) U.S. Cl.
CPC ........... *H04B 5/0056* (2013.01); *H03M 1/1019* (2013.01); *H03M 1/124* (2013.01); *H03M 1/46* (2013.01); *H04B 5/0025* (2013.01); *H04B 17/21* (2015.01)

(58) Field of Classification Search
CPC .. H04B 5/0025; H04B 5/0031; H04B 5/0056; H04B 5/0062; H04B 17/00; H04B 17/21; H04B 17/26; H04B 17/309; H03M 1/124; H03M 1/46; H03M 1/1014; H03M 1/1019
USPC ................... 455/41.1, 41.2, 574, 343.1, 343.3
See application file for complete search history.

(56) References Cited

U.S. PATENT DOCUMENTS 5,864,310 A * 1/1999 Khorramabadi ....... H03D 3/008
                                                    341/110
5,949,280 A   9/1999 Sasaki
(Continued)

FOREIGN PATENT DOCUMENTS

JP      3788445      4/2006
KR   10-0270227      7/2000
(Continued)

*Primary Examiner* — Duc M Nguyen
(74) *Attorney, Agent, or Firm* — Muir Patent Law, PLLC

(57) ABSTRACT

A receiver of a near field communication device includes a local oscillator, a first channel, and a second channel. The local oscillator may be configured to generate a first local oscillating signal. The first channel may be configured to process an input signal by mixing the input signal with the first local oscillating signal. The second channel may be configured to process the input signal by mixing the input signal with a second local oscillating signal that has a phase difference of 90 degrees with respect to the first local oscillating signal. Each of the first and second channels may include a comparator unit that includes a comparator configured to compare, in a comparator mode, an amplifier output signal with a reference voltage whose level increases in a step-wise manner and the comparator unit may be configured to set a level of the reference voltage to be used in a normal mode based on an output signal of the comparator.

20 Claims, 16 Drawing Sheets

(51) Int. Cl.
*H03M 1/12* (2006.01)
*H03M 1/10* (2006.01)

(56) References Cited

U.S. PATENT DOCUMENTS

| | | | | |
|---|---|---|---|---|
| 6,163,685 | A * | 12/2000 | Dilling | H04L 27/3809 375/345 |
| 6,424,284 | B1 * | 7/2002 | Lopata | H03M 1/662 341/163 |
| 6,914,522 | B2 | 7/2005 | King et al. | |
| 7,106,173 | B2 | 9/2006 | Scott et al. | |
| 7,336,935 | B2 | 2/2008 | Ho et al. | |
| 7,606,329 | B2 | 10/2009 | Yamauchi | |
| 7,623,593 | B2 | 11/2009 | Cheung et al. | |
| 7,650,122 | B2 | 1/2010 | Itkin et al. | |
| 8,351,885 | B2 | 1/2013 | Dubash et al. | |
| 8,587,477 | B2 * | 11/2013 | Samavati | G01S 19/33 342/357.76 |
| 2005/0024251 | A1 * | 2/2005 | Harada | H03M 1/1225 341/163 |
| 2005/0058228 | A1 * | 3/2005 | Birkett | H03G 3/001 375/345 |
| 2008/0018517 | A1 * | 1/2008 | Yamada | H03M 1/0675 341/165 |
| 2010/0084918 | A1 * | 4/2010 | Fells | H02J 5/005 307/32 |
| 2013/0003873 | A1 * | 1/2013 | Findlater | H04W 36/14 375/257 |

FOREIGN PATENT DOCUMENTS

KR    10-0715935    5/2007
KR    10-2010-0045629    5/2010

* cited by examiner

FIG. 8

|  | 1st | 2nd | ... | Mth |
|---|---|---|---|---|
| SRV11 | 0 | 0 |  | 0 |
| SRV12 | 0 | 0 |  | 0 |
| SRV13 | 0 | 0 |  | 0 |
| ⋮ | ⋮ | ⋮ | ... | ⋮ |
| SRV1(P-1) | 0 | X |  | X |
| SRV1P | X |  |  |  |

→ ITERATION

RVL

RECEIVER OF NFC DEVICE AND NFC DEVICE INCLUDING THE SAME

CROSS-REFERENCE TO RELATED APPLICATIONS

This application claims the benefit of priority under 35 U.S.C. §119 to Korean Patent Application No. 10-2013-0117119, filed on Oct. 1, 2013, in the Korean Intellectual Property Office (KIPO), the content of which is incorporated herein in its entirety by reference.

BACKGROUND

1. Field

Example embodiments on the inventive concept relate generally to wireless communication techniques, and more particularly, to receivers of near field communication (NFC) devices and NFC devices including the same.

2. Description of the Related Art

Near field communication (NFC) is a type of wireless communication technology that has recently witnessed extensive use. A wireless communication system that employs NFC may perform both data writing and data reading functions. In addition, because NFC is used in situations in which the distance of communication is short, a wireless communication system that employs NFC may ensure a relatively high level of security and may be implemented at a relatively low cost. A data receiver that uses NFC may receive various types of data according to a communication protocol. Thus, technologies designed to increase reception efficiency and to reduce an area occupied by an NFC circuit are sought to be developed.

SUMMARY

The present inventive concept provides a receiver of an NFC device configured to adaptively set a reference voltage level.

The present inventive concept also provides an NFC device that includes the receiver.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a receiver of a near field communication (NFC) device including a local oscillator, a first channel, and a second channel. The local oscillator may be configured to generate a first local oscillating signal. The first channel may be configured to process an input signal by mixing the input signal with the first local oscillating signal. The second channel may be configured to process the input signal by mixing the input signal with a second local oscillating signal that has a phase difference of 90 degrees with respect to the first local oscillating signal. Each of the first and second channels may include a comparator unit that includes a comparator configured to compare, in a comparator mode, an amplifier output signal with a reference voltage whose level increases in a step-wise manner and the comparator unit may be configured to set a level of the reference voltage to be used in a normal mode based on an output signal of the comparator.

The first channel may include a first mixer configured to mix the input signal with the first local oscillating signal to generate a first mixed signal, a first low-pass filter configured to filter the first mixed signal, a first variable gain amplifier configured to amplify an output of the first low-pass filter to provide a first amplifier output signal, and a first comparator unit that includes a first comparator configured to compare, in the comparator mode, the first amplifier output signal with a first reference voltage whose level increase in the step-wise manner.

The first comparator unit may include a programmable counter configured to perform, in the comparator mode, an up-counting operation to generate a counting value, a step reference voltage generator configured to generate, in the comparator mode, the first reference voltage whose level increases in the step-wise manner in response to the counting value, the first comparator configured to compare, in the comparator mode, the first amplifier output signal with the first reference voltage to provide a first comparator output signal, and a reference voltage setting unit configured to detect, in the comparator mode, a level of the first comparator output signal and configured to determine a level of the first reference voltage to be used in the normal mode based on the first comparator output signal whose level is not changed during M times. M may be an integer greater than one.

The reference voltage setting unit may include a latch unit configured to latch the first reference voltage in response to the first comparator output signal being at a high level, a register unit configured to receive the latched first reference voltages from the latch unit during the M times and to store the latched first reference voltages, a calculation unit configured to average the latched first reference voltages during the M times to provide a first average reference voltage, and a counter configured to count the latched first reference voltages during the M times to generate a first reset signal configured to reset the programmable counter.

The programmable counter may be configured to receive the first average reference voltage to set the counting value such that the step reference voltage generator is configured to provide, in the normal mode, the first reference voltage whose level is higher than the first average reference voltage.

The first reference voltage whose level is higher than the first average reference voltage may be higher than the first average reference voltage by at least one step.

The counter may be configured to count the latched first reference voltages during the M times to generate a first enable signal configured to enable the calculation unit.

The step reference voltage generator may include a variable resistor whose resistance is determined according to the counting value.

The second channel may include a phase shifter configured to shift a phase of the first local oscillating signal to generate the second local oscillating signal, a second mixer configured to mix the input signal with the second local oscillating signal to generate a second mixed signal, a second low-pass filter configured to filter the second mixed signal, a second variable gain amplifier configured to amplify an output of the second first low-pass filter to provide a second amplifier output signal, and a second comparator unit that includes a second comparator configured to compare, in the comparator mode, the second amplifier output signal with a second reference voltage whose level increases in the step-wise manner.

The second comparator unit may include a programmable counter configured to perform, in the comparator mode, an up-counting operation to generate a counting value, a step reference voltage generator configured to generate, in the comparator mode, the second reference voltage whose level increases in the step-wise manner in response to the counting value, the second comparator configured to compare, in the comparator mode, the second amplifier output signal with the second reference voltage to provide a second comparator output signal, and a reference voltage setting unit configured to detect, in the comparator mode, a level of the second comparator output signal and configured to determine a level of the second reference voltage to be used in the normal mode based on the second comparator output signal whose level is not changed during M times. M may be an integer greater than one.

The receiver of a NFC device may further include a demodulator configured to demodulate output signals of the first and second channels.

The foregoing and/or other features and utilities of the present inventive concept also provide a near field communication (NFC) device including a resonance unit and an NFC chip. The resonance unit may be configured to radiate, in a normal mode, an electro-magnetic wave to exchange data with an external NFC card. The NFC chip may include a receiver configured to receive an input signal. The receiver may include a local oscillator, a first channel, and a second channel. The local oscillator may be configured to generate a first local oscillating signal. The first channel may be configured to process the input signal by mixing the input signal with the first local oscillating signal. The second channel may be configured to process the input signal by mixing the input signal with a second local oscillating signal that has a phase difference of 90 degrees with respect to the first local oscillating signal. Each of the first and second channels may include a comparator unit that includes a comparator configured to compare, in a comparator mode, an amplifier output signal with a reference voltage whose level increases in a step-wise manner and the comparator unit configured to set a level of the reference voltage to be used in a normal mode based on an output signal of the comparator.

The first channel may include a first mixer configured to mix the input signal with the first local oscillating signal to generate a first mixed signal, a first low-pass filter configured to filter the first mixed signal, a first variable gain amplifier configured to amplify an output of the first low-pass filter to provide a first amplifier output signal, and a first comparator unit that includes a first comparator configured to compare, in the comparator mode, the first amplifier output signal with a first reference voltage whose level increase in the step-wise manner.

The first comparator unit may include a programmable counter configured to perform, in the comparator mode, an up-counting operation to generate a counting value, a step reference voltage generator configured to generate, in the comparator mode, the first reference voltage whose level increases in the step-wise manner in response to the counting value, the first comparator configured to compare, in the comparator mode, the first amplifier output signal with the first reference voltage to provide a first comparator output signal, and a reference voltage setting unit configured to detect, in the comparator mode, a level of the first comparator output signal and configured to determine a level of the first reference voltage to be used in the normal mode based on the first comparator output signal whose level is not changed during M times. M may be an integer greater than one.

The NFC device may be an NFC reader.

The foregoing and/or other features and utilities of the present inventive concept also provide a method of setting a reference voltage of a receiver of a Near Field Communication reader including monitoring an output of a comparator of the receiver of the Near Field Communication reader during an iteration of a time interval in which the Near Field Communication reader is configured in a mode to set the reference voltage to be used in an operating mode, the reference voltage applied to the comparator, and setting the reference voltage to be used in the operating mode in response to the output being constant during the iteration of the time interval.

The time interval may be a number of cycles of a clock.

The setting the reference voltage may include increasing a value of the reference voltage applied to the comparator.

The method may further include changing a value of the reference voltage applied to the comparator in response to a change in the output during the iteration of the time interval and repeating the monitoring and the setting.

The changing the value may be increasing the value.

The iteration may be a plurality of iterations and the setting the reference voltage may include determining an average value of the reference voltage applied to the comparator during the plurality of iterations of the time interval.

The foregoing and/or other features and utilities of the present inventive concept also provide a non-transitory computer-readable recording medium containing instructions which, when executed by an electronic processor, cause the electronic processor to monitor an output of a comparator of the receiver of the Near Field Communication reader during an iteration of a time interval in which the Near Field Communication reader is configured in a mode to set the reference voltage to be used in an operating mode, the reference voltage applied to the comparator, and to set the reference voltage to be used in the operating mode in response to the output being constant during the iteration of the time interval.

Accordingly, the receiver of the NFC reader and the NFC reader may adaptively set the level of the first reference voltage by increasing the reference voltage in a step-wise manner such that the level of the first comparator output signal is not changed, and thus the recognition range of the NFC reader may be increased while the variance of the recognition range of the NFC reader may be reduced.

BRIEF DESCRIPTION OF THE DRAWINGS

These and/or other features and utilities of the present general inventive concept will become apparent and more clearly understood from the following detailed description taken in conjunction with the accompanying drawings.

FIG. 8 is a diagram of an example of a process in which the first reference voltage of the first comparator unit illustrated in FIG. 4 is set according to embodiments of the present inventive concept.

DETAILED DESCRIPTION OF THE EMBODIMENTS

Figure 1:
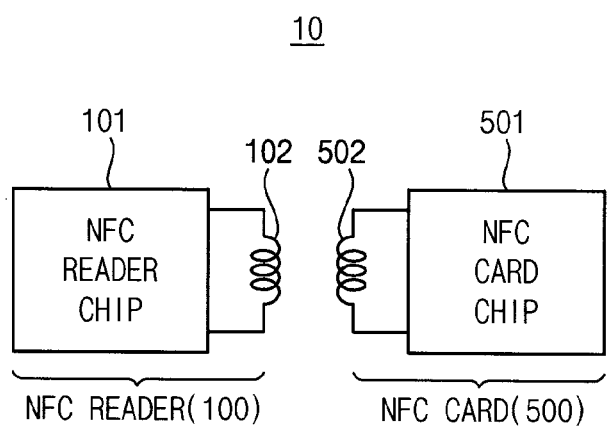
FIG. 1 is a diagram illustrating a near field communication (NFC) system according to embodiments of the present inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

The present general inventive concept may, however, be embodied in many different forms and should not be construed as limited to the example embodiments set forth herein. Rather, these example embodiments of the present general inventive concept are provided so that this disclosure is thorough and complete, and fully conveys the scope of the present general inventive concept to those skilled in the art.

It is understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present general inventive concept. As used herein, the term "and/or" includes any and all combinations of one or more of the associated listed items.

It is understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments of the present general inventive concept and is not intended to be limiting of the present general inventive concept. As used herein, the singular forms "a," "an" and "the" are intended to include the plural forms as well, unless the context clearly indicates otherwise. It is further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which the present general inventive concept belongs. It is further understood that terms, such as those defined in commonly used dictionaries, should be interpreted as having a meaning that is consistent with their meaning in the context of the relevant art and are not to be interpreted in an idealized or overly formal sense unless expressly so defined herein.

FIG. 1 is a diagram illustrating a near field communication (NFC) system 10 according to embodiments of the present inventive concept.

Referring to FIG. 1, the NFC system 10 may include a NFC reader 100 and a NFC card 500. The NFC reader 100 may include an NFC reader chip 101 and a first antenna 102, and the NFC card 500 may include an NFC card chip 501 and a second antenna 502. The NFC reader 100 and the NFC card 500 may exchange data with each other through the first and second antennas 102 and 502, and the NFC card 500 may accept a receiving voltage from the first antenna 102 through the second antenna 502. The NFC reader 100 may compare, in a comparator mode, an input signal with a reference voltage, whose level increases in a step-wise manner, to set a level of the reference voltage, which may not be changed while the data is not provided from the NFC card 500, and may transit to a normal mode to initiate an operation in the normal mode.

Figure 2:
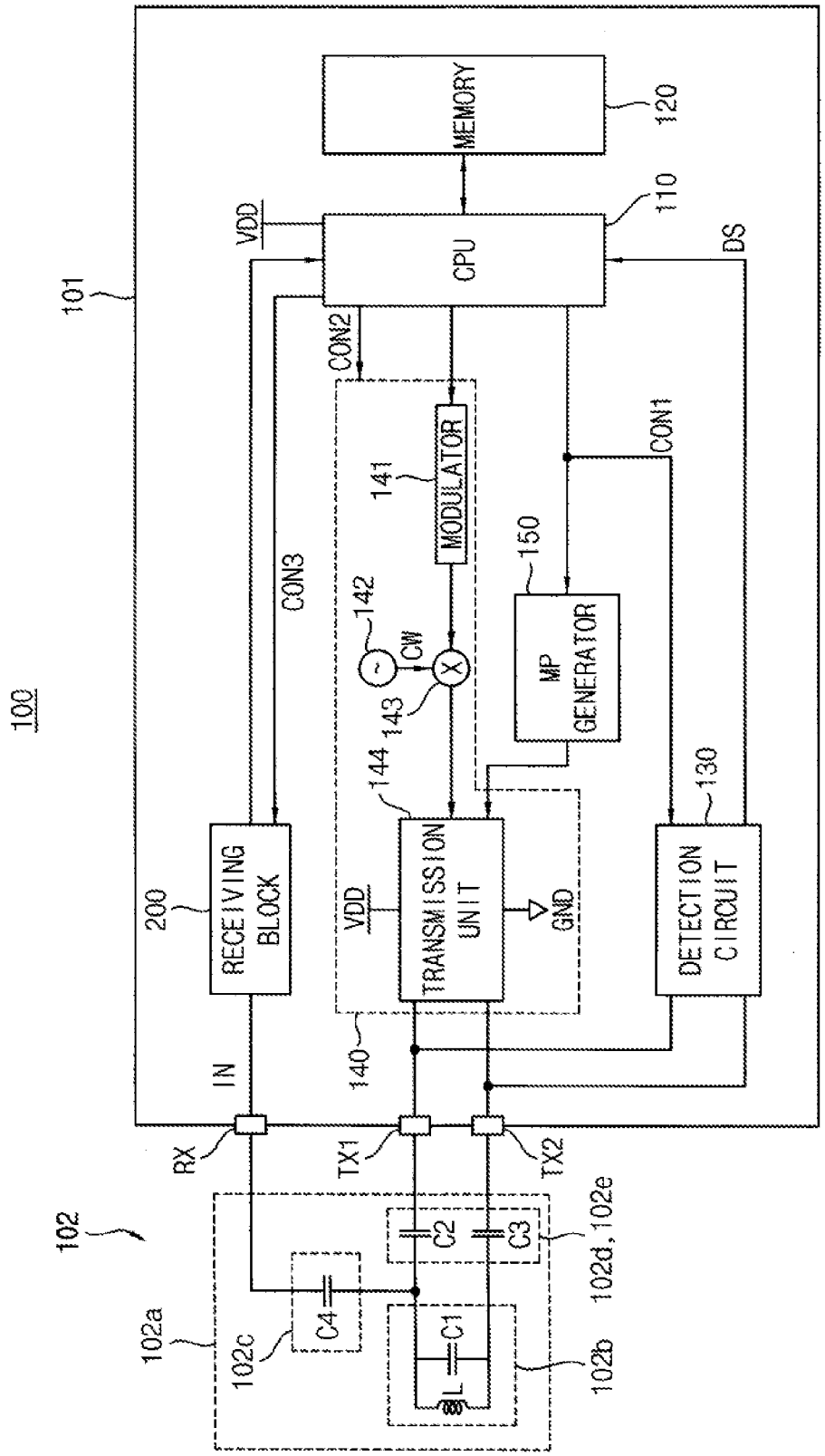
FIG. 2 is a block diagram of an example of the NFC reader illustrated in FIG. 1 according to embodiments of the present inventive concept.

FIG. 2 is a block diagram of an example of the NFC reader 100 illustrated in FIG. 1 according to embodiments of the present inventive concept.

Referring to FIG. 2, the NFC reader 100 may include the NFC reader chip 101 and the first antenna 102, which may include a resonance unit 102a. The NFC reader chip 101 may be connected to the resonance unit 102a through first and second transmission terminals TX1 and TX2 and a reception terminal RX.

The resonance unit 102a may include a resonance circuit 102b, which may include an antenna L and a first capacitor C1, a first filter 102c, which may include a fourth capacitor C4 through which the resonance circuit 102b may be connected to the reception terminal RX, and a matching unit 102d, which may include a second filter 102e, which may include a second capacitor C2 and a third capacitor C3 through which the resonance circuit 102b may be connected to the first and second transmission terminals TX1 and TX2 and which may perform an impedance matching.

The configuration of the resonance unit 102a illustrated in FIG. 2 may be an example only, and the resonance unit 102a according to embodiments of the present inventive concept may not be limited to the configuration illustrated in FIG. 2, but may be various limited.

The NFC reader chip 101 may include a central processing unit (CPU) 110 (or a processor), a memory 120, a receiving block 200 (or a receiver), a transmission block 140, which may include a modulator 141, an oscillator 142, a mixer 143, and a transmission unit 144, a magnetic pulse generator 150, and a detection circuit 130. The CPU 110 may control overall operations of the NFC reader chip 101. The CPU 110 may be operated by receiving a power source voltage VDD from a power source unit such as, for example, a battery.

When a transmission operation is performed in an active mode, the CPU 110 may read out output data from the memory 120 to provide the output data to the modulator 141. The modulator 141 may modulate the output data to generate a modulated signal. In addition, the oscillator 142 may generate a carrier signal CW that has a frequency that corresponds to a carrier frequency (for example, 13.56 MHz), and the mixer 143 may combine the carrier signal CW with the modulated signal to generate a transmission signal.

The transmission unit 144 may provide the transmission signal provided from the mixer 143 to the resonance unit 102a through the first and second transmission terminals TX1 and TX2, and the resonance unit 102a may radiate an electromagnetic wave that corresponds to the transmission signal. For example, the transmission unit 144 may be connected between the power source voltage VDD and a ground voltage GND. The transmission unit 144 may allow the first and second transmission terminals TX1 and TX2 to be connected to either the power source voltage VDD through a pull-up load (not illustrated) or the ground voltage GND through a pull-down load (not illustrated) based on the transmission signal, so that the transmission signal may be provided to the resonance unit 102a through the first and second transmission terminals TX1 and TX2.

When a reception operation is performed in the active mode, the receiving block 200 may demodulate a signal provided through the reception terminal RX from the resonance unit 102a to generate input data and may provide the input data to the CPU 110. The CPU 110 may store the input data in the memory 120.

In a standby mode, the magnetic pulse generator 150 may generate a magnetic pulse to be transmitted through the transmission unit 144 and the resonance unit 102a in response to a first control signal CON1 from the CPU 110, and the detection circuit 130 may determine whether the NFC card 500 is within a communication range based on the magnetic pulse that is transmitted through the transmission unit 144.

The detection circuit 130 may determine whether the NFC card 500 is within the communication range by generating a detection signal DS to be sent to the CPU 110 that indicates whether the NFC card 500 is within the communication range. The CPU 110 may receive the detection signal DS and may determine an operation mode of the NFC reader 100 according to a logic level of the detection signal DS from the detection circuit 130.

For example, when the NFC card 500 is out of the communication range of the NFC reader 100 and the detection signal DS is a low logic level, the CPU 110 may maintain the operation mode of the NFC reader 100 in the standby mode. For example, when the NFC card 500 is within the communication range of the NFC reader 100 and the detection signal DS is the high logic level, the CPU 110 may change the operation mode of the NFC reader 100 to the active mode.

In the active mode, the CPU 110 may provide a second control signal CON2 to enable the transmission block 140 and may transmit a request command through the transmission block 140. The CPU 110 may provide a third control signal CON3 to enable the receiving block 200 and the receiving block 200 may await a response from the NFC card 500 in response to the request command during a predetermined time interval. When the response is received in response to the request command during the predetermined time interval, the NFC reader 100 may initiate data transmission/reception with the NFC card 500. When the response is not received in response to the request command during the predetermined time interval, the CPU 110 may provide the second and third control signals CON2 and CON3 to disable, respectively, the transmission block 140 and the receiving block 200, and may provide the first control signal CON1 to the detection circuit 130 to perform the above-described detection operation.

The first through third control signals CON1-CON3 may include, for example, two or more bits. For example, in the standby mode, some bits of the second control signal CON2 may be used to disable the modulator 141, the oscillator 142, and/or the mixer 143, and other bits of the second control signal CON2 may be used to enable the transmission unit 144 to transmit the magnetic pulse.

Before the NFC reader 100 performs a read operation that includes the standby mode and the active mode, the CPU 110 may control, by using the third control signal CON3, the receiving block 200 to operate in the comparator mode. As explained above, in the comparator mode, the receiving block 200 may compare the input signal (for example, a noise signal) with the reference voltage, whose level increases in the step-wise manner, and may set a level of the reference voltage to be used in the normal mode based on a comparator output signal. When the level of the reference voltage to be used in the normal mode is set, the NFC reader 100 may enter into the standby mode and the active mode.

Figure 3:
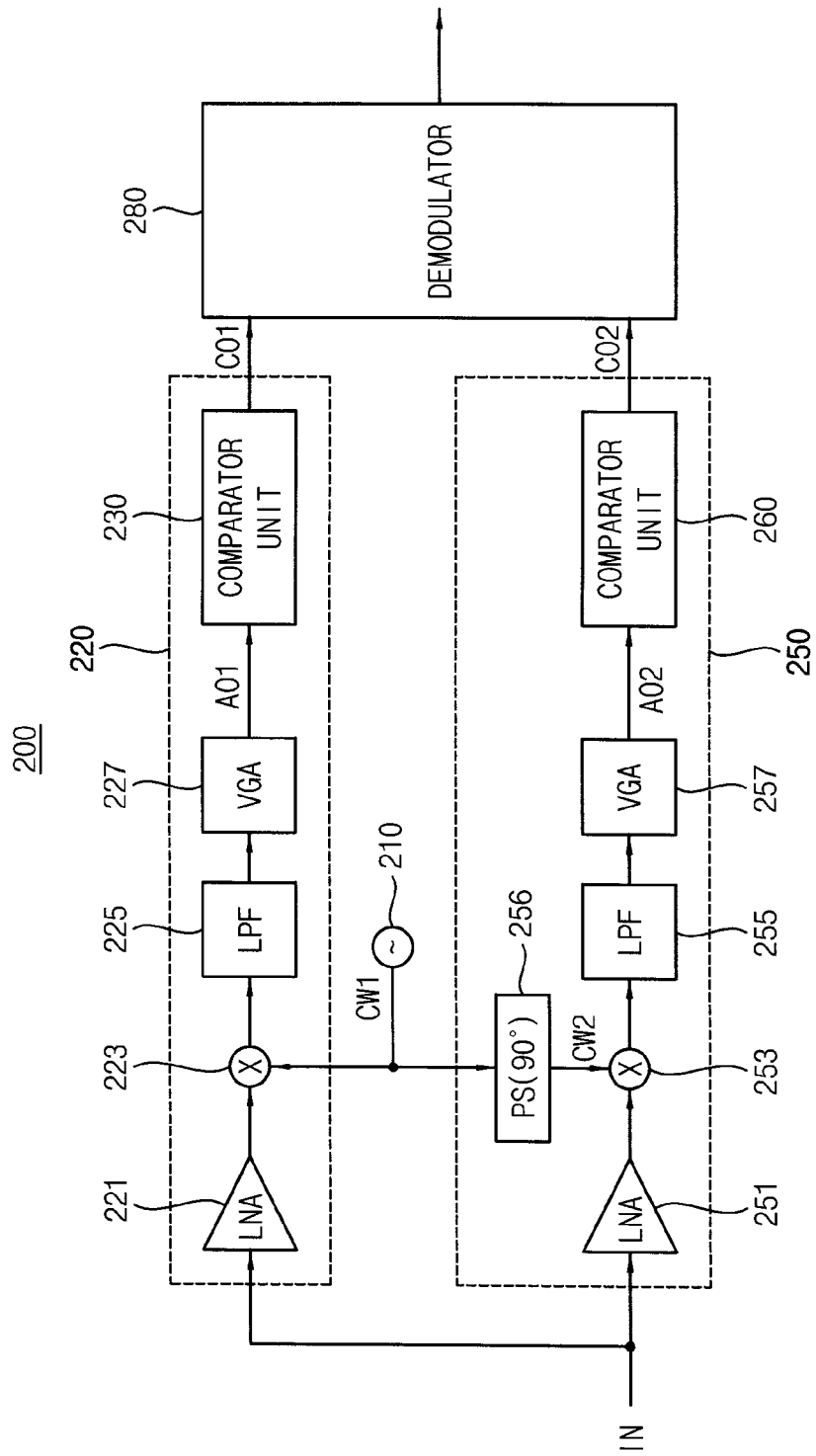
FIG. 3 is a block diagram of an example of the receiving block illustrated in FIG. 2 according to embodiments of the present inventive concept.

FIG. 3 is a block diagram of an example of the receiving block 200 illustrated in FIG. 2 according to embodiments of the present inventive concept.

Referring to FIG. 3, the receiving block 200 of the NFC reader 100 may include a local oscillator 210, a first channel 220, a second channel 250, and a demodulator 280.

The first channel 220 may include a low-noise amplifier (LNA) 221, a mixer 223, a low-pass filter (LPF) 225, a variable gain amplifier (VGA) 227, and a first comparator unit 230. The second channel 250 may include an LNA 251, a mixer 253, an LPF 255, a phase shifter 256, a VGA 257, and a second comparator unit 260. The first channel 220 may be an in-phase channel that may process an input signal IN by mixing the input signal IN with a carrier wave signal CW1 (or a first local oscillating signal), and the second channel 250 may be a quadrature channel that may process the input signal IN by mixing the input signal IN with a second local oscillating signal CW2 that has a 90-degree phase difference with respect to the first local oscillating signal CW1.

The LNA 221 may amplify the input signal IN, and the mixer 223 may mix an output of the LNA 221 with the first local oscillating signal CW1 to provide a mixed signal to the LPF 225. The LPF 225 may low-pass filter the mixed signal to provide a low-pass filtered signal to the VGA 227. The VGA 227 may amplify an output of the LPF 225 to provide a first amplifier output signal AO1 to the first comparator unit 230. The first comparator unit 230 may compare the first amplifier output signal AO1 with the reference voltage, whose level increases in the step-wise manner, and may set the level of the reference voltage of the first comparator unit 230 to be used in the normal mode based on the level of a first comparator output signal, which may not be changed. In addition, the first comparator unit 230 may process the input signal IN in the read mode, after the comparator mode, to provide a first channel output signal CO1 to the demodulator 280.

The phase shifter 256 may shift a phase of the first local oscillating signal CW1 by 90 degrees to generate the second local oscillating signal CW2. The LNA 251 may amplify the input signal 251, and the mixer 253 may mix an output of the LNA 251 with the second local oscillating signal CW2 to provide a mixed signal to the LPF 255. The LPF 255 may low-pass filter the mixed signal to provide a low-pass filtered signal to the VGA 257. The VGA 257 may amplify an output of the LPF 255 to provide a second amplifier output signal AO2 to the second comparator unit 260. The second comparator unit 260 may compare the second amplifier output signal AO2 with the reference voltage, whose level increases in the step-wise manner, and may set the level of the reference voltage of the second comparator unit 260 to be used in the normal mode based on the level of a second comparator output signal, which may not be changed. In addition, the second comparator unit 260 may process the input signal IN in the read mode, after the comparator mode, to provide a second channel output signal CO2 to the demodulator 280.

The demodulator 280 may demodulate the first and second channel output signals CO1 and CO2 to be provided to the CPU 110.

Figure 4:
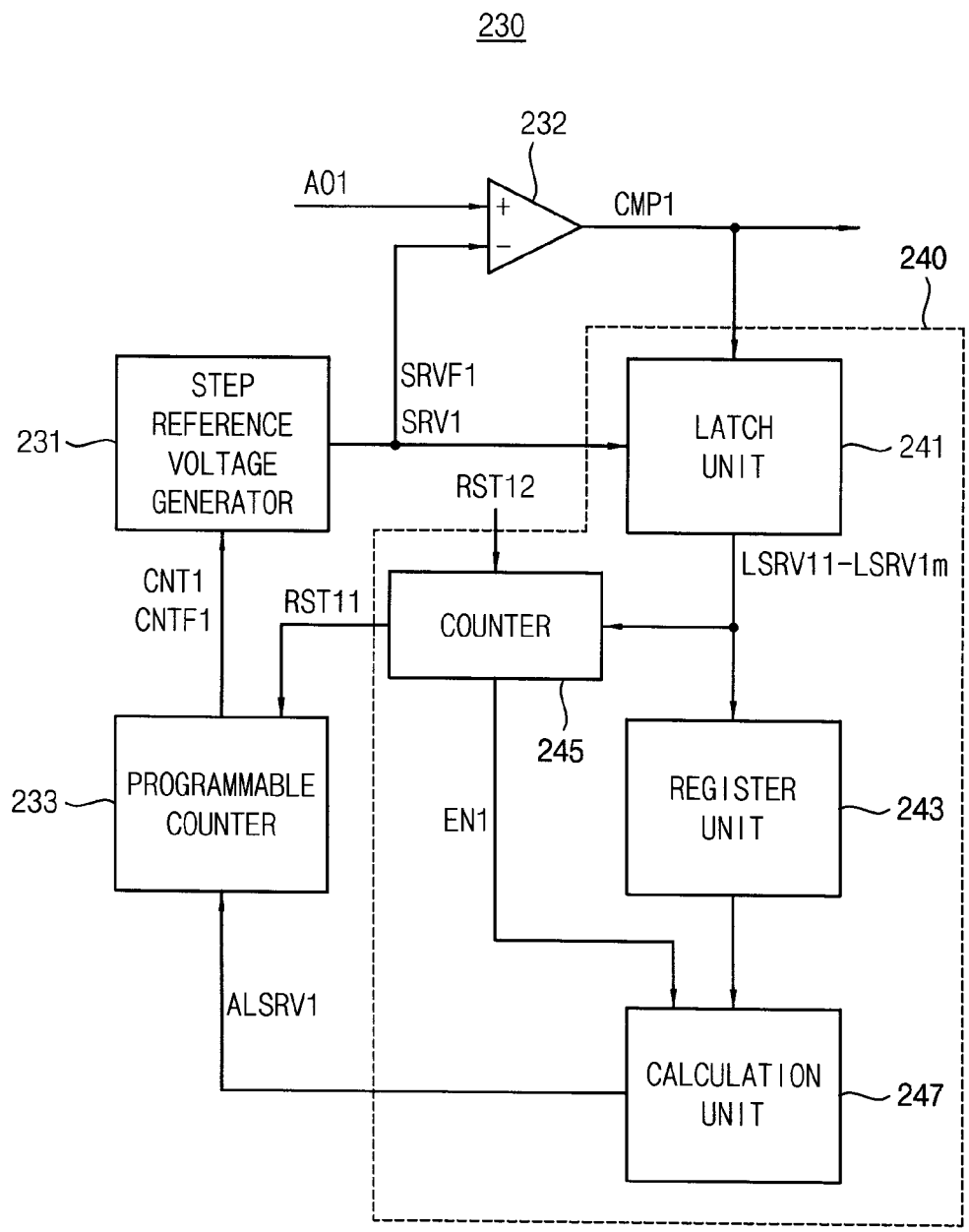
FIG. 4 is a block diagram of an example of the first comparator unit illustrated in FIG. 3 according to embodiments of the present inventive concept.

FIG. 4 is a block diagram of an example of the first comparator unit 230 illustrated in FIG. 3 according to embodiments of the present inventive concept.

Referring to FIG. 4, the first comparator unit 230 may include a comparator 232, a step reference voltage generator 231, a programmable counter 233, and a reference voltage setting unit 240.

The programmable counter 233 may perform, in the comparator mode, an up-counting operation to generate a counting value CNT1, and may generate, in the normal mode, a final counting value CNTF1 based on a first average reference voltage ALSRV1. The step reference voltage generator 231 may generate, in the comparator mode, a first reference voltage SRV1, whose level increases in the step-wise manner based on the counting value CNT1, and may generate, in the normal mode, a fixed first reference voltage SRVF1 based on the final counting value CNTF1. The comparator 232 may compare, in the comparator mode, a first amplifier output signal AO1 with the first reference voltage SRV1, whose level increases in the step-wise manner, to generate a first comparator output signal CMP1, and may compare, in the normal mode, the first amplifier output signal AO1 with the fixed first reference voltage SRVF1 to generate the first comparator output signal CMP1. The reference voltage setting unit 240 may detect, in the normal mode, a level of the first comparator output signal CMP1 and may determine, in the normal mode, a level of the reference voltage based on the first comparator output signal CMP1, whose level may not be changed during M times (M being an integer greater than one).

The reference voltage setting unit 240 may include a latch unit 241, a register unit 243, a counter 245, and a calculation unit 247. The latch unit 241 may latch the first reference voltage SRV1 in response to the first comparator output signal CMP1 being the high logic level. The register unit 243 may store latched first reference voltages LSRV11-LSRV1m from the latch unit 241 during the M times. The calculation unit 247 may average the latched first reference voltages LSRV11-LSRV1m during the M times to provide the first average reference voltage ALSRV1. The counter 245 may count the latched first reference voltages LSRV11-LSRV1m during the M times. In response to the counting during the M times being complete, the counter 245 may provide the calculation unit 247 with an enable signal EN1 that enables the calculation unit 247 and may provide the programmable counter 233 with a first reset signal RST11 that resets the programmable counter 233. The counter 245 may be reset in response to a second reset signal RST12 from the CPU 110.

After the programmable counter 233 is reset in response to the first reset signal RST11, the programmable counter 233 may receive the first average reference voltage ALSRV1 to provide the step reference voltage generator 231 with the final counting value CNTF1 that corresponds to the first average reference voltage ALSRV1. In response to the final counting value CNTF1, the step reference voltage generator 231 may provide the comparator 232 with the first fixed reference voltage SRVF1, whose level may be higher than the first average reference voltage ALSRV1 by at least one step, as the reference voltage.

Figure 5:
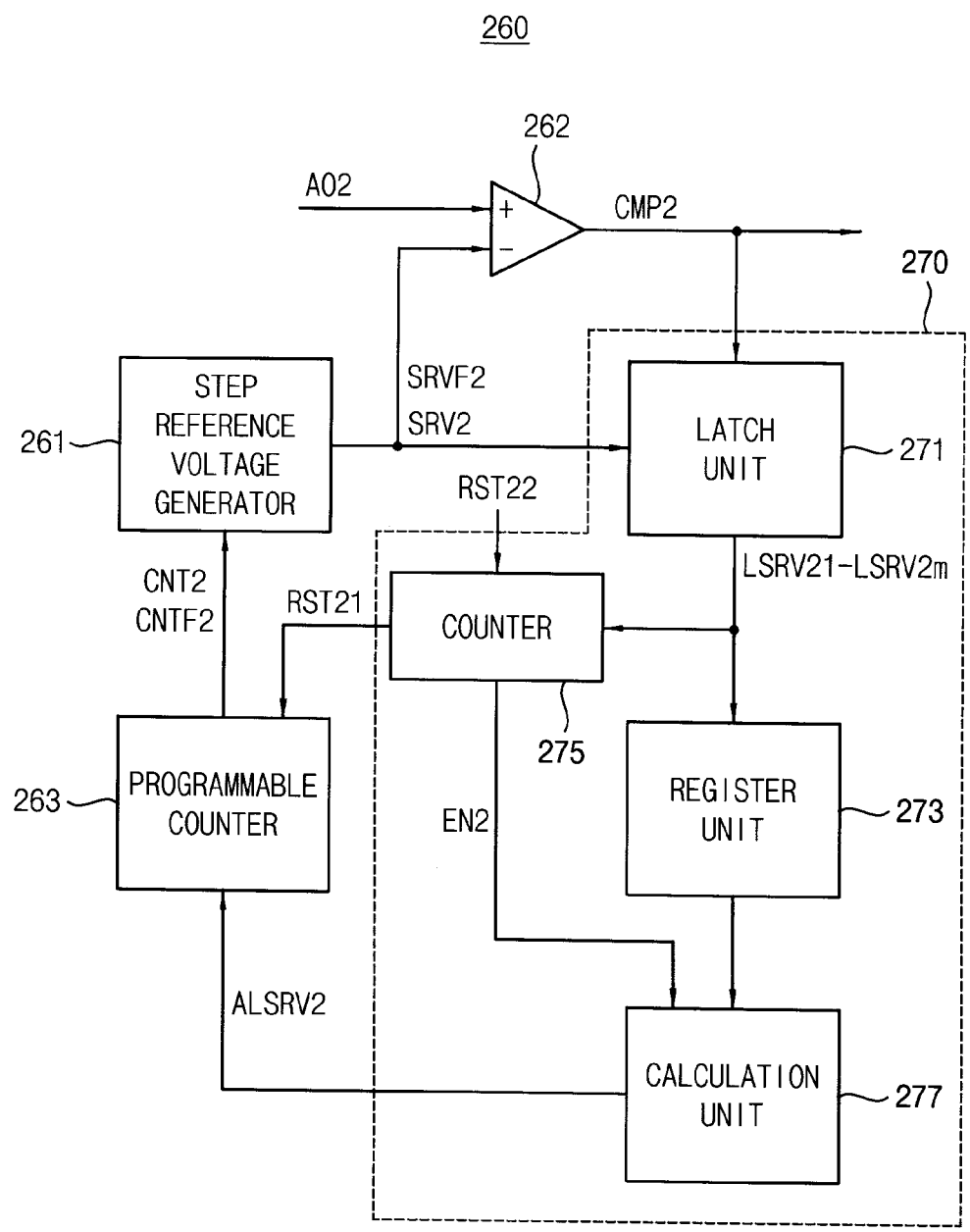
FIG. 5 is a block diagram of an example of the second comparator unit illustrated in FIG. 3 according to embodiments of the present inventive concept.

FIG. 5 is a block diagram of an example of the second comparator unit 260 illustrated in FIG. 3 according to embodiments of the present inventive concept.

Referring to FIG. 5, the second comparator unit 260 may include a comparator 262, a step reference voltage generator 261, a programmable counter 263, and a reference voltage setting unit 270.

The programmable counter 263 may perform, in the comparator mode, an up-counting operation to generate a counting value CNT2, and may generate, in the normal mode, a final counting value CNTF1 based on a second average reference voltage ALSRV2. The step reference voltage generator 261 may generate, in the comparator mode, a second reference voltage SRV2, whose level increases in the step-wise manner based on the counting value CNT2, and may generate, in the normal mode, a fixed second reference voltage SRVF2 based on the final counting value CNTF2. The comparator 262 may compare, in the comparator mode, a second amplifier output signal AO2 with the second reference voltage SRV2, whose level increases in the step-wise manner, to generate a second comparator output signal CMP2, and may compare, in the normal mode, the second amplifier output signal AO2 with the fixed second reference voltage SRVF2 to generate the second comparator output signal CMP2. The reference voltage setting unit 270 may detect, in the normal mode, a level of the second comparator output signal CMP2 and may determine, in the normal mode, a level of the reference voltage based on the second comparator output signal CMP2, whose level may not be changed during M times (M being an integer greater than one).

The reference voltage setting unit 270 may include a latch unit 271, a register unit 273, a counter 275, and a calculation unit 277. The latch unit 271 may latch the second reference voltage SRV2 in response to the second comparator output signal CMP2 being the high logic level. The register unit 273 may store latched second reference voltages LSRV21-LSRV2m from the latch unit 271 during the M times. The calculation unit 277 may average the latched second reference voltages LSRV21-LSRV2m during the M times to provide the second average reference voltage ALSRV2. The counter 275 may count the latched second reference voltages LSRV21-LSRV2m during the M times. In response to the counting during the M times being complete, the counter 275 may provide the calculation unit 277 with an enable signal EN2 that enables the calculation unit 277 and may provide the programmable counter 263 with a first reset signal RST21 that resets the programmable counter 263. The counter 275 may be reset in response to a second reset signal RST22 from the CPU 110.

After the programmable counter 263 is reset in response to the first reset signal RST21, the programmable counter 263 may receive the second average reference voltage ALSRV2 to provide the step reference voltage generator 261 with the final counting value CNTF2 that corresponds to the second average reference voltage ALSRV2. In response to the final counting value CNTF2, the step reference voltage generator 261 may provide the comparator 262 with the second fixed reference voltage SRVF2, whose level may be higher than the second average reference voltage ALSRV2 by at least one step, as the reference voltage.

Figure 6:
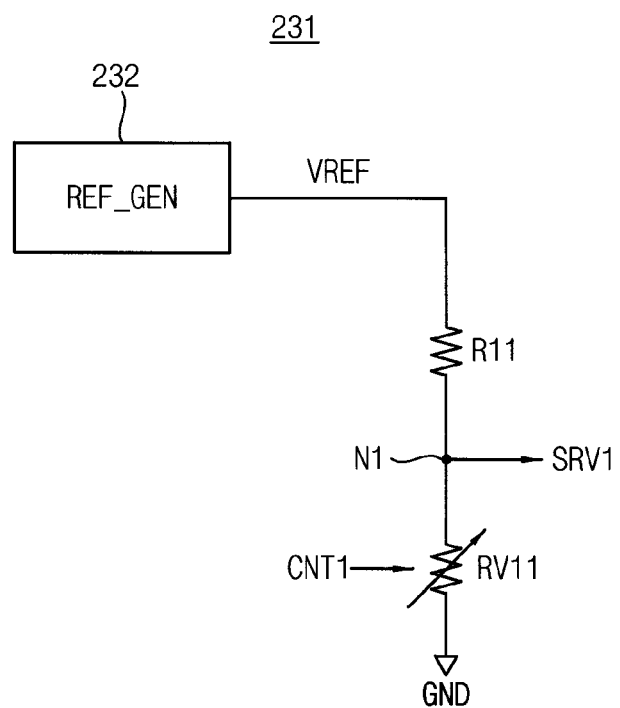
FIG. 6 is a schematic diagram of an example of the step reference voltage generator illustrated in FIG. 4 according to embodiments of the present inventive concept.

FIG. 6 is a schematic diagram of an example of the step reference voltage generator 231 illustrated in FIG. 4 according to embodiments of the present inventive concept.

Referring to FIG. 6, the step reference voltage generator 231 may include a reference voltage generator 232, a resistor R11, and a variable resistor RV11.

The reference voltage generator 232 may generate a reference voltage VREF, whose level may be regular. The resistor R11 may be connected between the reference voltage generator 232 and a first node N1, and the variable resistor RV11 may be connected between the first node N1 and the ground voltage GND. The variable resistor RV11 may have a resistance that corresponds to the counting value CNT1.

Because the resistor R11 and the variable resistor RV11 may operate as a voltage divider that divides the reference voltage VREF, the step reference voltage generator 231 may generate, in the comparator mode, the first reference voltage SRV1, whose level corresponds to the counting value CNT1, to output the first reference voltage SRV1 via the first node N1 and may generate, in the normal mode, the fixed first reference voltage SRVF1 to output the fixed first reference voltage SRVF1 via the first node N1.

Figure 7:
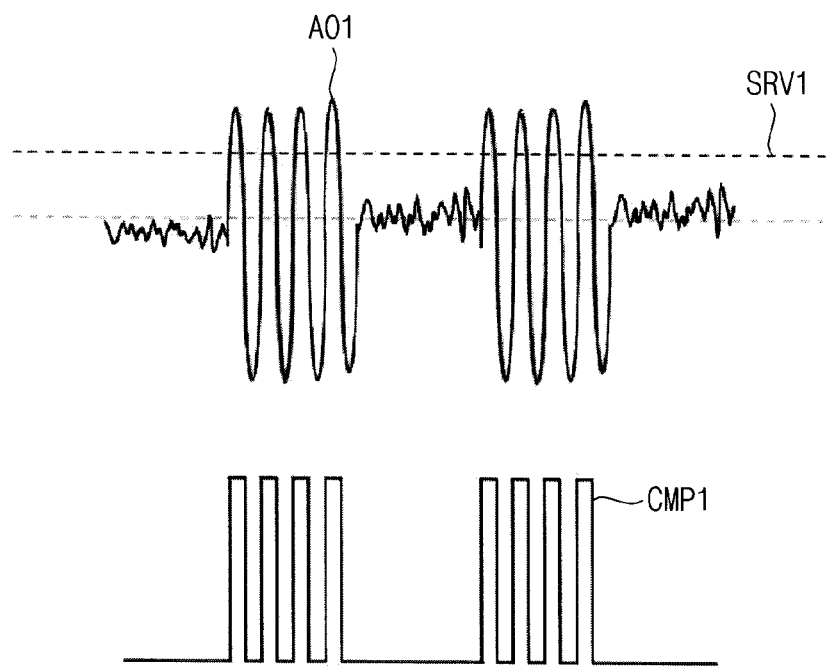
FIG. 7 includes graphs of various signals in the first comparator unit illustrated in FIG. 4 according to embodiments of the present inventive concept.

FIG. 7 includes graphs of various signals in the first comparator unit illustrated in FIG. 4 according to embodiments of the present inventive concept.

FIG. 7 illustrates examples of the first amplifier output signal AO1, the first reference voltage SRV1, and the first comparator output signal CMP1 as these signals may exist in the comparator mode.

Referring to FIGS. 1, 4 and 7, when the NFC reader 100 transmits a sub carrier signal to the NFC card 500, it is assumed that the NFC reader 100 receives no signal from the NFC card 500. However, the NFC reader 100 may regard a noise signal as the input signal IN. In this case, the step reference voltage generator 231 may increase, in the comparator mode, the level of the first reference voltage SRV1 in the step-wise manner in response to the counting value CNT1. In the comparator mode, in response to the level of the first reference voltage SRV1 being higher than a level of the input signal IN, the first comparator output signal CMP1 may be maintained at a low level. Therefore, in response to the first comparator output signal CMP1 not being changed during the predetermined time interval, the level of the first reference voltage SRV1 may be determined to be properly set. Setting the level of the first reference voltage SRV1 may be repeated M times, and the first average reference voltage may be calculated by averaging the first reference voltages SRV1 during the M times. After the fixed first reference voltage SRVF1 is set such that the level of the fixed first reference voltage SRVF1 is higher than the first average reference voltage by at least one step, the NFC reader 100 may enter into the normal mode and the NFC reader 100 may perform normal communication with the NFC card 500.

FIG. 8 is a diagram of an example of a process in which the first reference voltage SRV1 of the first comparator unit 230 illustrated in FIG. 4 is set according to embodiments of the present inventive concept.

Referring to FIGS. 4 and 8, the first comparator output signal CMP1 may be provided as a low level from a first reference voltage level SRV1P in a first iteration of the comparator mode. The first comparator output signal CMP1 may be provided as a low level from a first reference voltage level SRV1(P−1) in a second iteration of the comparator mode. The first comparator output signal CMP1 may be provided as a low level from the first reference voltage level SRV1(P−1) in a Mth iteration of the comparator mode (where P is an integer greater than 5). In FIG. 8, symbol 'O' indicates that the first comparator output signal CMP1 transitions to a high level, and symbol 'X' indicates that the first comparator output signal CMP1 is not changed, that is, the first comparator output signal CMP1 is maintained at a low level. Therefore, the first average reference voltage ARSRV1 may be obtained by averaging the first reference voltages SRV1P, SRV1(P−1), SRV1(P−1) during the M times while the first comparator output signal CMP1 is not changed.

The programmable counter 233 may receive the first average reference voltage ALSRV1 to fix the final counting value CNTF1. In response to the final counting value CNTF1, the step reference voltage generator 231 may provide the comparator 232 with the fixed first reference voltage SRVF1, whose level is maintained with respect to the noise signal, and the comparator 232 may compare the first amplifier output signal AO1 with the fixed first reference voltage SRVF1 to output the first comparator output signal CMP1.

In general, when the level of the first reference voltage SRV1 is low, a recognition range of the NFC reader 100 may be increased, but the NFC reader 100 may regard a noise signal as a normal signal, which may be a cause of communication error. When the level of the first reference voltage SRV1 is high, the NFC reader 100 may not regard a noise signal as a normal signal, but the recognition range of the NFC reader 100 may be decreased. Such noise levels may be different in respective NFC receiving blocks due to process variance. In conventional NFC readers, the reference voltages of NFC receiving blocks may be regularly set without regard to the NFC receiving blocks, and thus variance of the recognition range of the NFC readers tends to increase.

However, the receiving block 200 of the NFC reader 100 may adaptively set the level of the first reference voltage SRV1 by increasing the reference voltage in the step-wise manner such that the level of the first comparator output signal CMP1 is not changed, and thus the recognition range of the NFC reader 100 may be increased while the variance of the recognition range of the NFC reader 100 may be reduced.

Figure 9:
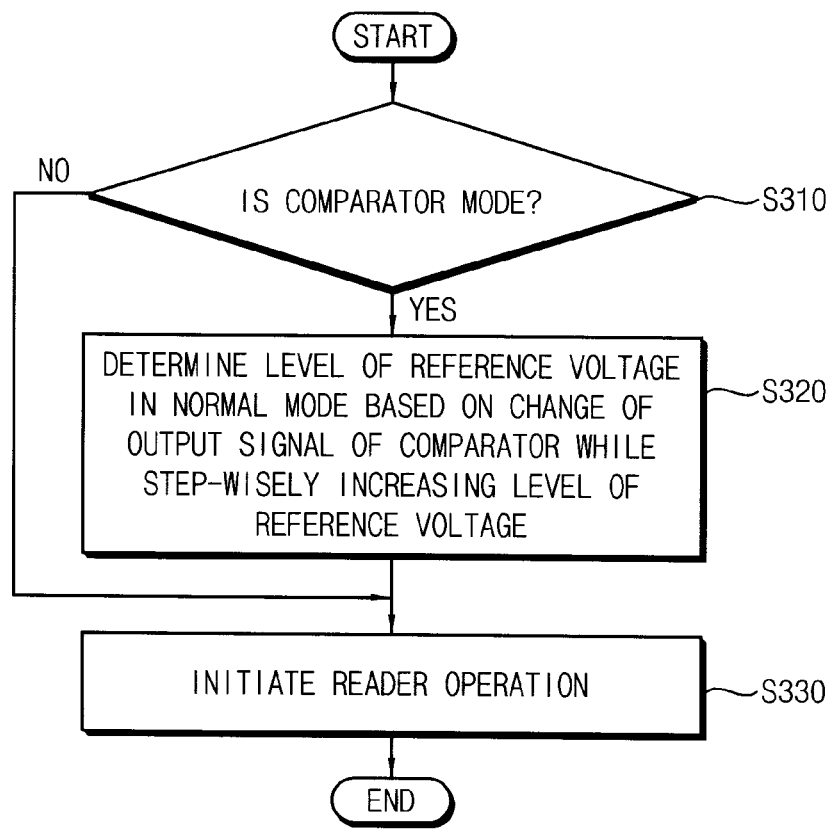
FIG. 9 is a flow chart illustrating an example of a method of operating the NFC reader according to embodiments of the present inventive concept.

FIG. 9 is a flow chart illustrating an example of a method of operating the NFC reader 100 according to embodiments of the present inventive concept.

Referring to FIGS. 2, 3, and 9, in a method of operating the NFC reader 100 according to embodiments of the present inventive concept, it is determined whether the NFC reader 100 is in the comparator mode (S310). When the NFC reader 100 is in the comparator mode (YES in S310), a level of the reference voltage in the normal mode may be determined based on the first comparator output signal CMP1 by increasing the level of the reference voltage SRV1 in the step-wise manner (S320). After the level of the reference voltage in the normal mode is determined, the normal mode operation of the NFC reader 100 may be initiated (S330). When the NFC reader 100 is not in the comparator mode (NO in S310), the normal mode operation of the NFC reader 100 may be directly initiated (S330).

Figure 10:
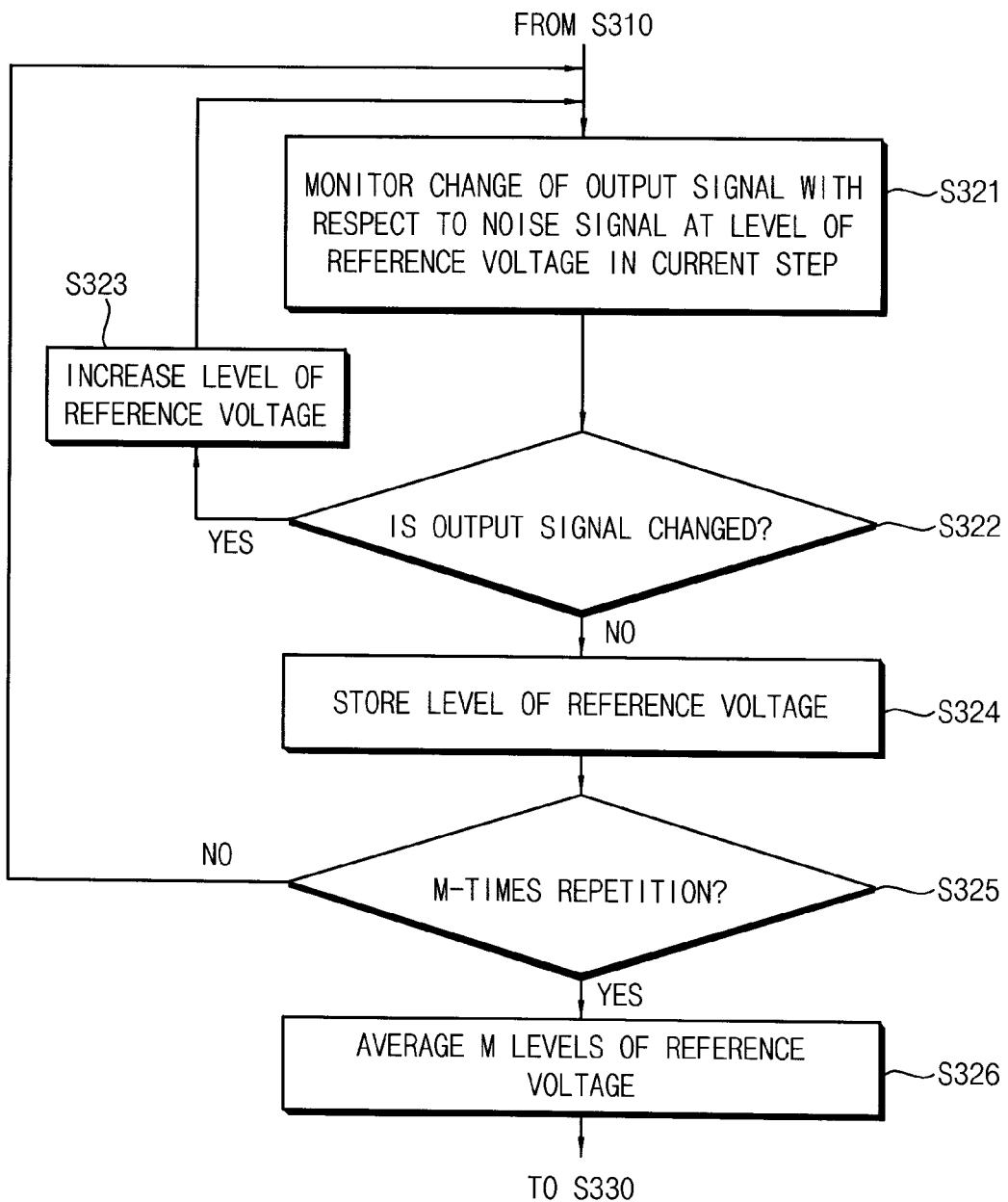
FIG. 10 is a flow chart illustrating an example of the operation of setting the reference voltage in the normal mode illustrated in FIG. 9 according to embodiments of the present inventive concept.

FIG. 10 is a flow chart illustrating an example of the operation of setting the reference voltage in the normal mode illustrated in FIG. 9 according to embodiments of the present inventive concept.

Referring to FIGS. 2, 3, 4, and 10, to set the reference voltage in the normal mode based on the first comparator output signal CMP1 by increasing the level of the reference voltage SRV1 in the step-wise manner, a change of the first comparator output signal CMP1 in response to a noise signal at a current level of the reference voltage STV1 may be monitored (S321). It may be determined whether the first comparator output signal CMP1 is changed (S322). When the first comparator output signal CMP1 is changed (or transitions) (YES in S322), the step reference voltage generator 231 may increase the level of the reference voltage SRV1 (S323). When the first comparator output signal CMP1 is not changed (NO in S322), the current level of the reference voltage SRV1 may be latched and stored, for example, in the register unit 243 (S324). It may be determined whether latching and storing the level of the reference voltage SRV1 is repeated M times (S325). When latching and storing the level of the reference voltage SRV1 is not repeated M times (NO in S325), the method may return to the step (S321). When latching and storing the level of the reference voltage SRV1 is repeated M times (YES in S325), the latched reference voltages LSRV11-LSRV1m may be averaged and the first average reference voltage ALSRV1 may be provided to the programmable counter 233 (S326).

Figure 17:
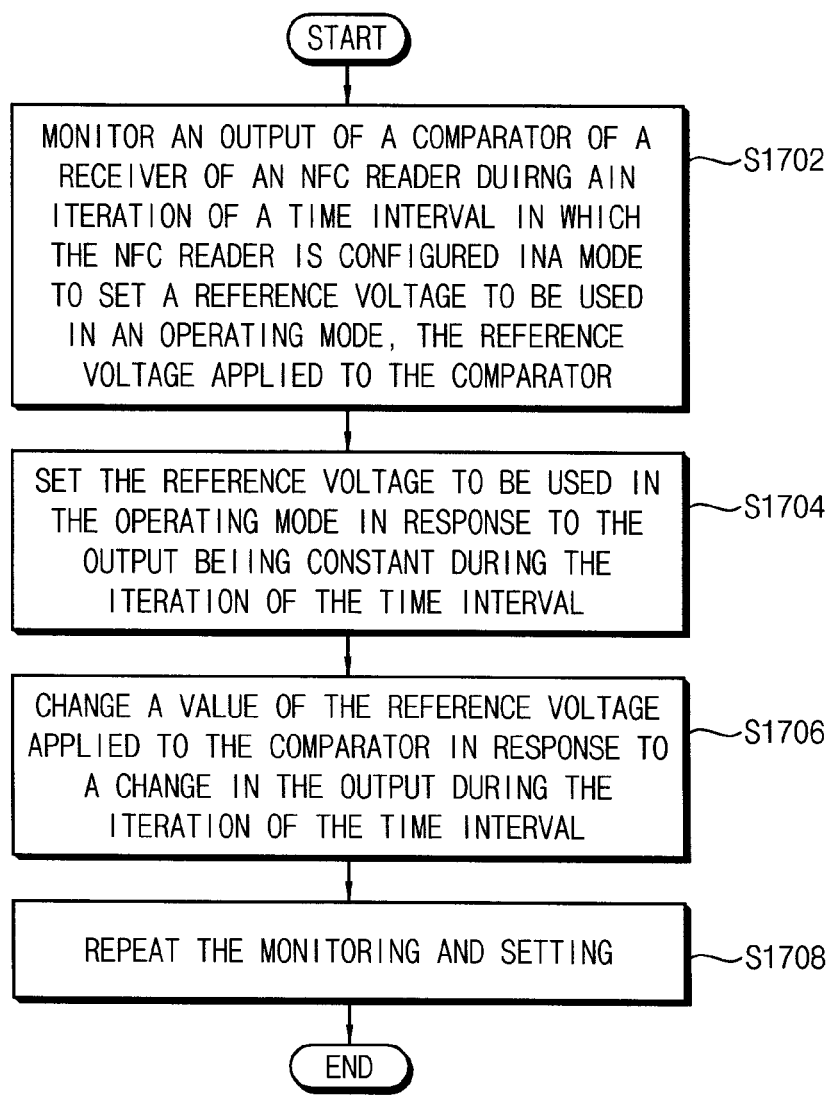
FIG. 17 is a flow chart illustrating a method of setting a reference voltage of a receiver of a Near Field Communication reader according to embodiments of the present inventive concept.

FIG. 17 is a flow chart illustrating a method of setting a reference voltage of a receiver of a Near Field Communication reader according to embodiments of the present inventive concept. In an operation 1702, an output of a comparator of the receiver of the Near Field Communication reader may be monitored during an iteration of a time interval in which the Near Field Communication reader is configured in a mode to set the reference voltage to be used in an operating mode. The reference voltage may be applied to the comparator. In an operation 1704 the reference voltage to be used in the operating mode may be set in response to the output being constant during the iteration of the time interval. The time interval may be a number of cycles of a clock. The setting the reference voltage may include increasing a value of the reference voltage applied to the comparator. Optionally, at an operation 1706, a value of the reference voltage applied to the comparator may be changed in response to a change in the output during the iteration of the time interval. The changing the value may be increasing the value. Optionally, at an operation 1708, the monitoring and the setting may be repeated. The iteration may be a plurality of iterations and the setting the reference voltage may include determining an average value of the reference voltage applied to the comparator during the plurality of iterations of the time interval.

Figure 11A:
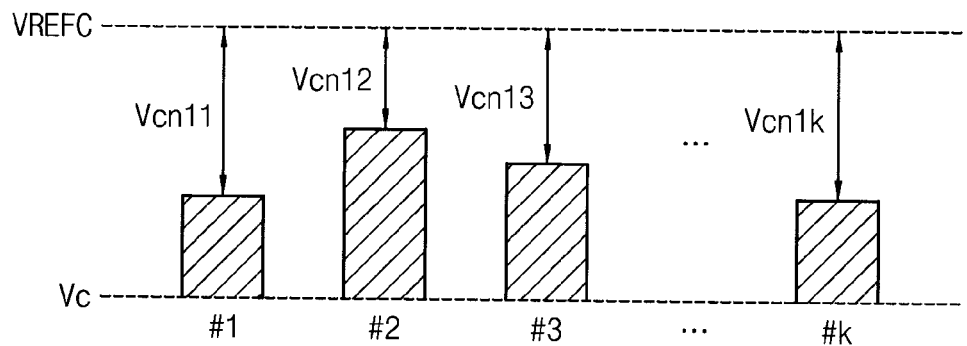
FIGS. 11A and 11B include graphs that illustrate the performance of the receiving blocks of the NFC reader before adaptive reference voltage setting is employed.
Figure 11B:
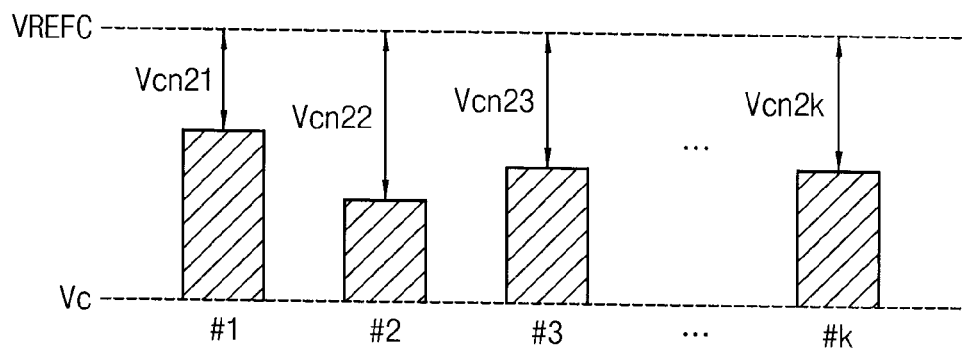

FIGS. 11A and 11B include graphs that illustrate the performance of the receiving blocks of the NFC reader before adaptive reference voltage setting is employed.

Figure 12A:
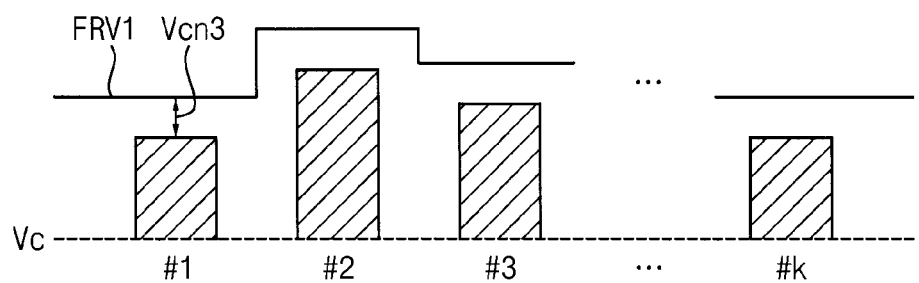
FIGS. 12A and 12B include graphs that illustrate the performance of the receiving blocks of the NFC reader after adaptive reference voltage setting is employed according to embodiments of the present inventive concept.
Figure 12B:
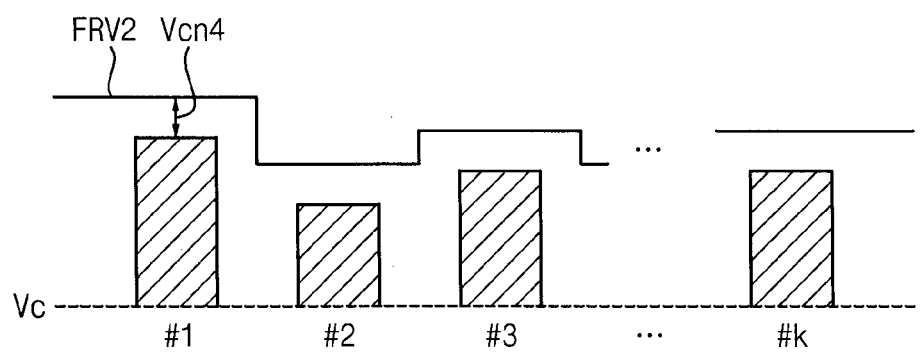

FIGS. 12A and 12B include graphs that illustrate the performance of the receiving blocks 200 of the NFC reader 100 after adaptive reference voltage setting is employed according to embodiments of the present inventive concept.

FIG. 11A includes a graph that illustrates the performance of the receiving blocks of the NFC reader in the in-phase channel and FIG. 11B includes a graph that illustrates the performance of the receiving blocks of the NFC reader in the quadrature channel.

Referring to FIG. 11A, before the adaptive reference voltage setting is employed, because a regular reference voltage VREFC is applied to k receiving blocks #1-#k in the in-phase channel, voltage differences Vcn11-Vcn1k between the regular reference voltage VREFC and peak noise levels of the k receiving blocks #1-#k may be different among the k receiving blocks #1-#k. Therefore, variance of the recognition range of the k receiving blocks #1-#k may be increased.

Referring to FIG. 11B, before the adaptive reference voltage setting is employed, because the regular reference voltage VREFC is applied to the k receiving blocks #1-#k in the quadrature channel, voltage differences Vcn21-Vcn2k between the regular reference voltage VREFC and the peak noise levels of the k receiving blocks #1-#k may be different among the k receiving blocks #1-#k. Therefore, the variance of the recognition range of the k receiving blocks #1-#k may be increased.

Referring to FIG. 12A, after the adaptive reference voltage setting is employed, because a reference voltage FRV1 is individually and adaptively set and respectively applied to the k receiving blocks #1-#k in the in-phase channel, voltage difference Vcn3 between the reference voltage FRV1 and the peak noise levels of the k receiving blocks #1#k may be substantially the same among the k receiving blocks #1-#k. Therefore, the variance of the recognition range of the k receiving blocks #1-#k may be greatly reduced.

Referring to FIG. 12B, after the adaptive reference voltage setting is employed, because a reference voltage FRV2 is individually and adaptively set and respectively applied to the k receivers #1-#k in the quadrature channel, voltage difference Vcn4 between the reference voltage FRV2 and the peak noise levels of the k receivers #1-#k may be substantially the same among the k receivers #1-#k. Therefore, the variance of the recognition range of the k receiving blocks #1-#k may be greatly reduced.

In FIGS. 11A through 12B, a symbol Vc denotes a center value of a noise signal.

Figure 13:
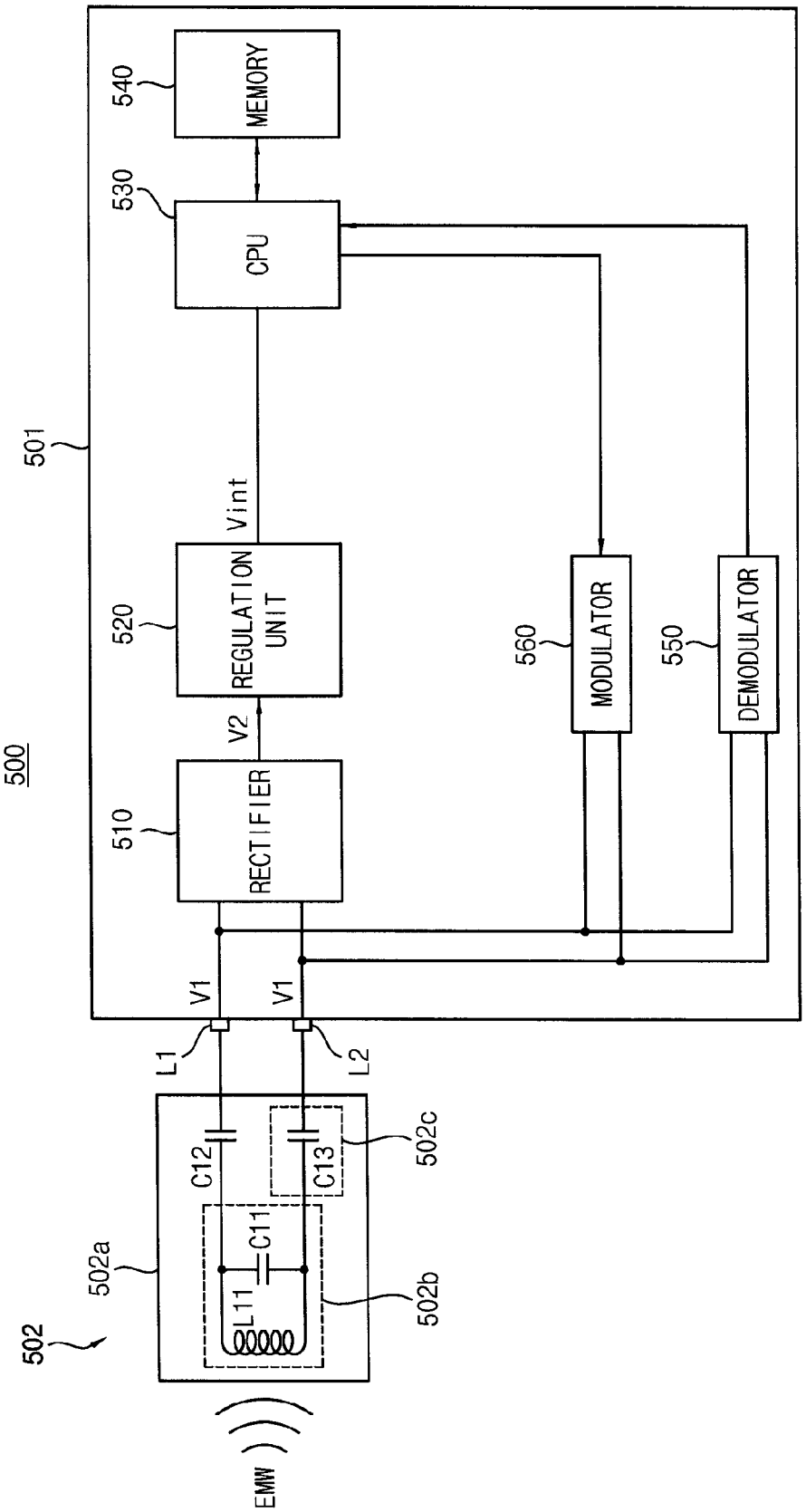
FIG. 13 is a block diagram of an example of the NFC card illustrated in FIG. 1 according to embodiments of the present inventive concept.

FIG. 13 is a block diagram of an example of the NFC card 500 illustrated in FIG. 1 according to embodiments of the present inventive concept.

Referring to FIG. 13, the NFC card 500 may include the second antenna 502, which may include a resonance unit 502a, and the NFC card chip 501.

The NFC card chip 501 may be connected to the resonance unit 502a through first and second power terminals L1 and L2.

The resonance unit 502a may include a resonance circuit 502b, which may include an antenna L11 and a first capacitor C11, second and third capacitors C12 and C13 through which an induced voltage, in response to an electromagnetic wave EMW, may be transferred to the first and second power terminals L1 and L2, and a filter 502c, which may include the third capacitor C13. The resonance unit 502a may transfer the induced voltage in response to the electromagnetic wave EMW as a first voltage V1 to the NFC card chip 501.

The configuration of the resonance unit 502a illustrated in FIG. 13 may be an example only, and the resonance unit 502a according to embodiments of the present inventive concept may not be limited to the configuration illustrated in FIG. 13, but may be various modified.

The NFC card chip 501 may receive the first voltage V1 from the resonance unit 502a through the first and second power terminals L1 and L2.

The NFC card chip 501 may include a rectifier 510, a regulation unit 520, a central processing unit (CPU) 530, a memory 540, a demodulator 550, and a modulator 560.

The rectifier 510 may rectify the first voltage V1 to generate a second voltage V2 that is direct-current (DC) voltage.

The regulation unit 520 may generate, for the CPU 530, the demodulator 550, and the modulator 560, an internal voltage Vint with a regular level, which may be used in the NFC card chip 501.

The CPU 530 may control overall operations of the NFC card chip 501. When a reception operation is performed, the demodulator 550 may demodulate a signal, provided through the first and second power terminals L1 and L2 from the resonance unit 502a, to generate input data and may provide the input data to the CPU 530. The CPU 530 may store the input data in the memory 540.

When a transmission operation is performed, the CPU 530 may read out output data from the memory 540 to provide the output data to the modulator 560. The modulator 560 may modulate the output data to provide a modulated signal to the first and second power terminals L1 and L2. For example, the modulator 560 may perform a load modulation of the output data to generate the modulated signal.

Figure 14:
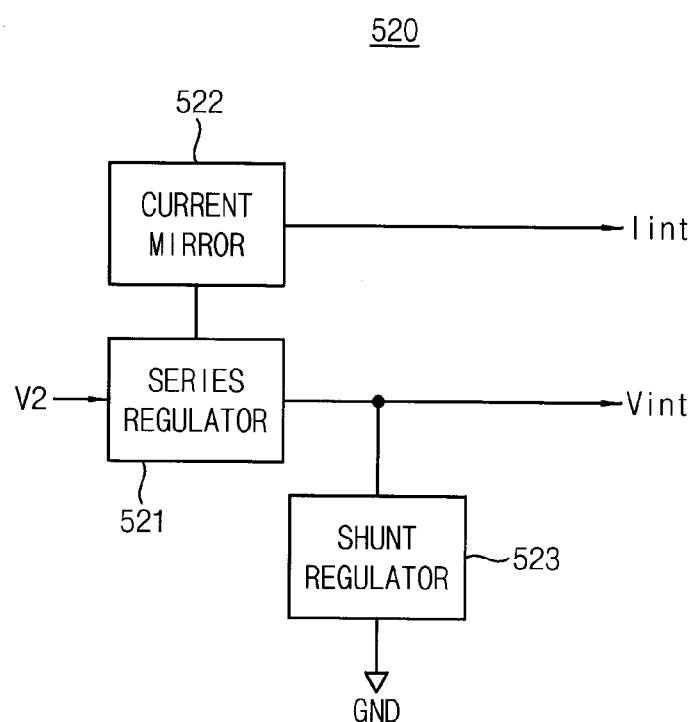
FIG. 14 is a block diagram of an example of the regulation unit illustrated in FIG. 13 according to embodiments of the present inventive concept.

FIG. 14 is a block diagram of an example of the regulation unit illustrated in FIG. 13 according to embodiments of the present inventive concept.

Referring to FIG. 14, the regulation unit 520 may include a series regulator 521, a shunt regulator 523, and a current mirror 524.

The series regulator 521 may receive the second voltage V2 from the rectifier 521 and the shunt regulator 523 may be connected between an output terminal of the series regulator 521 and the ground voltage GND. Thus, the series and shunt regulators 521 and 523 may generate an internal voltage Vint that has the regular level and which may be usable in the NFC card chip 501 that also uses the second voltage V2.

The current mirror 522 may generate an internal current Iint that has an intensity that may be proportional to that of a current that flows through the series regulator 521.

Figure 15:
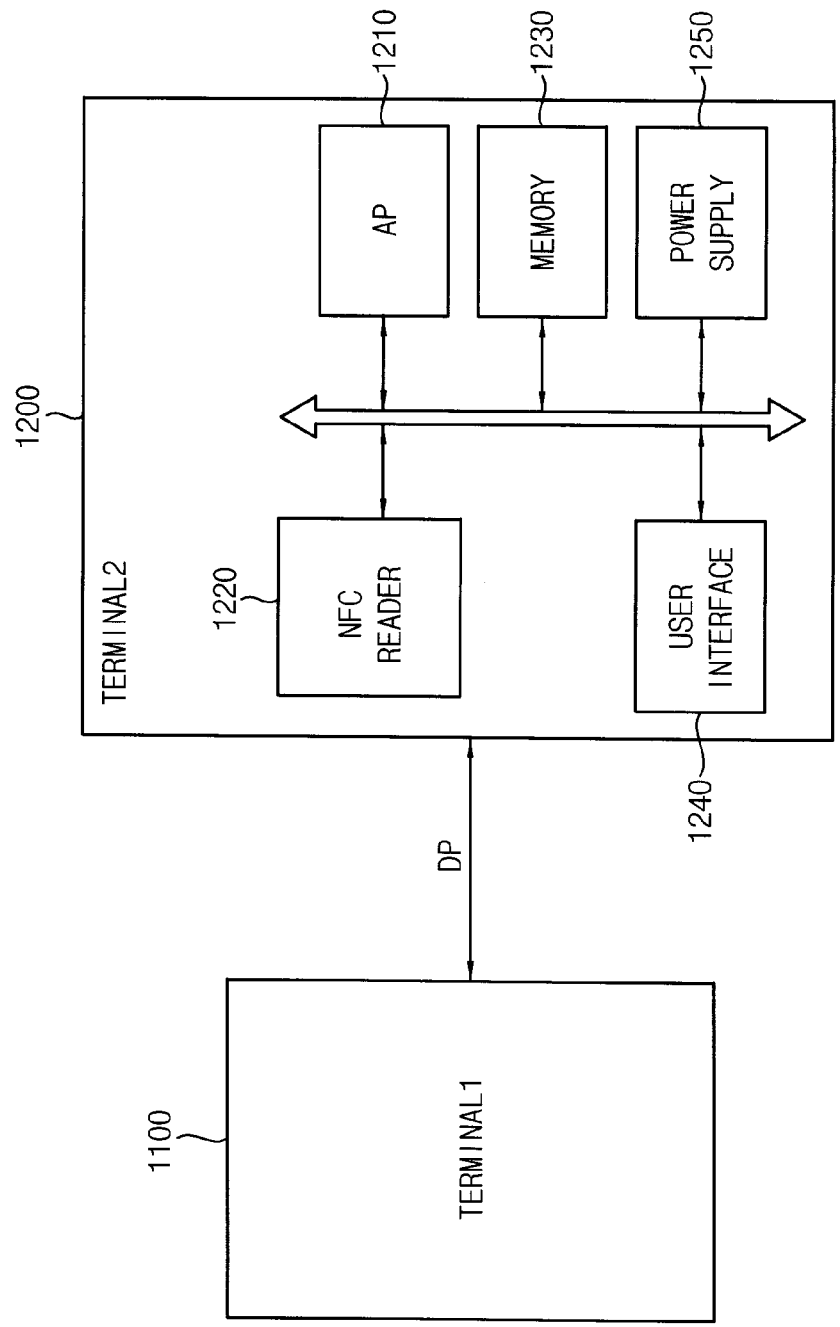
FIG. 15 is a block diagram illustrating a wireless communication system according to embodiments of the present inventive concept.
Figure 16:
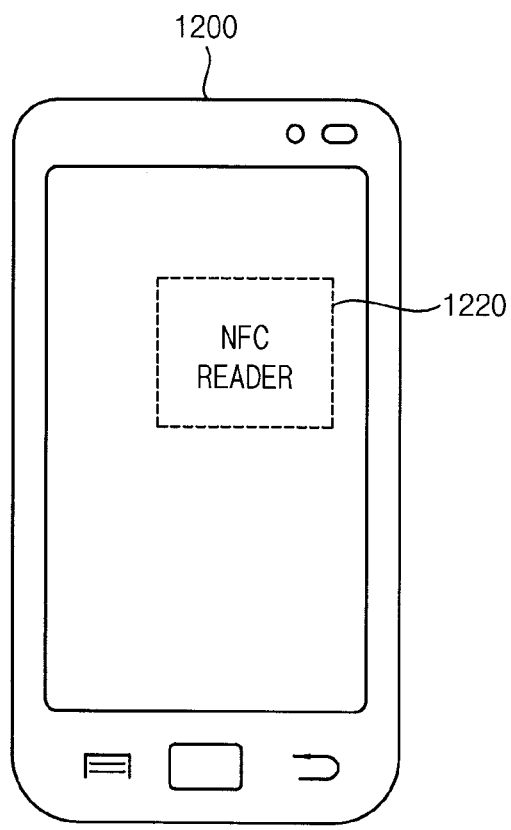
FIG. 16 is a representation of an example of a second terminal included in the wireless communication system illustrated in FIG. 15.

FIG. 15 is a block diagram illustrating a wireless communication system 1000 according to embodiments of the present inventive concept. FIG. 16 is a representation of an example of a second terminal 1200 included in the wireless communication system 1000 illustrated in FIG. 15.

Referring to FIGS. 15 and 16, the wireless communication system 1000 may include a first terminal 1100 and the second terminal 1200.

The first terminal 1100 and the second terminal 1200 may exchange a data packet DP and may transmit first data DAT1 (not illustrated) and/or second data DAT2 according to the operation mode. For example, the first terminal 1100 may serve as a reader (or initiator) and the second terminal 1200 may serve as a card (or target).

The second terminal 1200 may receive the data packet DP transmitted from the first terminal 1100. The second terminal 1200 may include a NFC reader 1220 and may further include an application processor 1210, a memory device 1230, a user interface 1240, and a power supply 1250.

In an embodiment of the present inventive concept, the second terminal 1200 may be a mobile device. For example, the second terminal 1200 may be any mobile system, such as a mobile phone, a smart phone, a tablet computer, a laptop computer, a personal digital assistant (PDA), a portable media player (PMP), a digital camera, a portable game console, a music player, a camcorder, a video player, a navigation system, etc.

The application processor 1210 may execute the operating system (OS) to drive the second terminal 1200. In addition, the application processor 1210 may execute applications, such as, for example, an internet browser, a game application, a video player application, etc. According to embodiments of the present inventive concept, the application processor 1210 may include a single processor core or a plurality of processor cores. In embodiments of the present inventive concept, the application processor 1210 may further include a cache memory located inside or outside the application processor 1210.

The memory device 1230 may store data processed by the application processor 1210 and may serve as a working memory. In addition, the memory device 1230 may store a boot image for booting the second terminal 1200, a file system associated with the OS, a device driver associated with an external device (not illustrated) connected to the second terminal 1200, an application program executed by the second terminal 1200, etc. For example, the memory device 1230 may include a volatile memory, e.g., a dynamic random-access memory (DRAM), a static random-access memory (SRAM), a mobile DRAM, or a nonvolatile memory, e.g., an electrically erasable programmable read-only memory (EE-PROM), a flash memory, a phase-change RAM (PRAM), a resistive RAM (RRAM), a magnetoresistive RAM (MRAM), a ferroelectric RAM (FRAM), a nano floating gate memory (NFGM), and a polymer random access memory (PoRAM).

The user interface 1240 may include at least one input device, such as, for example, a keypad and/or a touch screen, and/or at least one output device, such as, for example, a speaker and/or a display device. The power supply 1250 may supply operating power to the second terminal 1200. In addition, the second terminal 1200 may further include a baseband chipset, an image sensor, etc.

The NFC reader 1220 may employ the NFC reader 100 illustrated in FIG. 2. Therefore, the NFC reader 1220 may include the receiving block 200 illustrated in FIG. 3 and the NFC reader 1220 may adaptively set the level of the first reference voltage by increasing the reference voltage in the step-wise manner such that the level of the first comparator output signal is not changed, and thus the recognition range of the NFC reader 1220 may be increased while the variance of the recognition range of the NFC reader 1220 may be reduced.

According to embodiments of the present inventive concept, the second terminal 1200 and/or components of the second terminal 1200 may be packaged in various forms, such as, for example, package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), or wafer-level processed stack package (WSP).

Although not illustrated in the drawings, the wireless communication system 1000 for NFC may be a bidirectional communication system configured to perform data reading and data writing operations, so the first terminal 1100 may also include the data receiver for NFC according to embodiments of the present inventive concept. The first terminal 1100 may further include components, such as, for example, a processor, a memory device, a user interface, and a power supply.

As described above, the receiving block of the NFC reader and the NFC reader may adaptively set the level of the first reference voltage by increasing the reference voltage in the step-wise manner such that the level of the first comparator output signal is not changed, and thus the recognition range of the NFC reader may be increased while the variance of the recognition range of the NFC reader may be reduced.

Embodiments of the present inventive concept may be applied to the terminal for NFC and the wireless communication system 1000 may include the same, which may operate in the comparator mode. For example, embodiments of the present inventive concept may be applied to various terminals, such as a mobile phone, a smart phone, a tablet personal computer (PC), a laptop computer, a personal digital assistant (PDA), a portable multimedia player (PMP), a digital camera, a music player, a portable game console, and a navigation system.

The present general inventive concept can also be embodied as computer-readable codes on a computer-readable medium. For example, one of skill in the art understands that at least the method illustrated in FIG. 17 may be performed under the control of an electronic processor. The computer-readable medium can include a computer-readable recording medium and a computer-readable transmission medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can be transmitted through carrier waves or signals (e.g., wired or wireless data transmission through the Internet). Also, functional programs, codes, and code segments to accomplish the present general inventive concept can be easily construed by programmers skilled in the art to which the present general inventive concept pertains.

The foregoing is illustrative of embodiments of the present general inventive concept and is not to be construed as limiting thereof. Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A receiver of a near field communication (NFC) device, the receiver comprising:
   a local oscillator configured to generate a first local oscillating signal; a first channel configured to process an input signal by mixing the input signal with the first local oscillating signal; and
   a second channel configured to process the input signal by mixing the input signal with a second local oscillating signal that has a phase difference of 90 degrees with respect to the first local oscillating signal,
   wherein each of the first and second channels comprises a comparator unit that includes a comparator configured to compare, in a comparator mode, an amplifier output signal with a reference voltage whose level increases in a step-wise manner and the comparator unit is configured to set a level of the reference voltage to be used in a normal mode based on an output signal of the comparator,
   wherein the first channel comprises:
   a first mixer configured to mix the input signal with the first local oscillating signal to generate a first mixed signal;
   a first low-pass filter configured to filter the first mixed signal;
   a first variable gain amplifier configured to amplify an output of the first low-pass filter to provide a first amplifier output signal; and
   a first comparator unit that includes a first comparator configured to compare, in the comparator mode, the first amplifier output signal with a first reference voltage whose level increases in the step-wise manner,
   wherein the first comparator unit comprises:
   a programmable counter configured to perform, in the comparator mode, an up-counting operation to generate a counting value;
   a step reference voltage generator configured to generate, in the comparator mode, the first reference voltage whose level increases in the step-wise manner in response to the counting value;
   the first comparator configured to compare, in the comparator mode, the first amplifier output signal with the first reference voltage to provide a first comparator output signal; and
   a reference voltage setting unit configured to detect, in the comparator mode, a level of the first comparator output signal and configured to determine a level of the first reference voltage to be used in the normal mode based on the first comparator output signal whose level is not changed during M times, M being an integer greater than one.

2. The receiver of the NFC device of claim 1, wherein the reference voltage setting unit comprises:
   a latch unit configured to latch the first reference voltage in response to the first comparator output signal being at a high level;
   a register unit configured to receive the latched first reference voltages from the latch unit during the M times and to store the latched first reference voltages;
   a calculation unit configured to average the latched first reference voltages during the M times to provide a first average reference voltage; and
   a counter configured to count the latched first reference voltages during the M times to generate a first reset signal configured to reset the programmable counter.

3. The receiver of the NFC device of claim 2, wherein the programmable counter is configured to receive the first average reference voltage to set the counting value such that the step reference voltage generator is configured to provide, in the normal mode, the first reference voltage whose level is higher than the first average reference voltage.

4. The receiver of the NFC device of claim 3, wherein the first reference voltage whose level is higher than the first average reference voltage is higher than the first average reference voltage by at least one step.

5. The receiver of the NFC device of claim 2, wherein the counter is configured to count the latched first reference voltages during the M times to generate a first enable signal configured to enable the calculation unit.

6. The receiver of the NFC device of claim 1, wherein the step reference voltage generator includes a variable resistor whose resistance is determined according to the counting value.

7. The receiver of the NFC device of claim 1, wherein the second channel comprises:
   a phase shifter configured to shift a phase of the first local oscillating signal to generate the second local oscillating signal;
   a second mixer configured to mix the input signal with the second local oscillating signal to generate a second mixed signal;
   a second low-pass filter configured to filter the second mixed signal;
   a second variable gain amplifier configured to amplify an output of the second low-pass filter to provide a second amplifier output signal; and
   a second comparator unit that includes a second comparator configured to compare, in the comparator mode, the second amplifier output signal with a second reference voltage whose level increases in the step-wise manner.

8. The receiver of the NFC device of claim 7, wherein the second comparator unit comprises:
   a programmable counter configured to perform, in the comparator mode, an up-counting operation to generate a counting value;
   a step reference voltage generator configured to generate, in the comparator mode, the second reference voltage whose level increases in the step-wise manner in response to the counting value;

the second comparator configured to compare, in the comparator mode, the second amplifier output signal with the second reference voltage to provide a second comparator output signal; and a reference voltage setting unit configured to detect, in the comparator mode, a level of the second comparator output signal and configured to determine a level of the second reference voltage to be used in the normal mode based on the second comparator output signal whose level is not changed during M times, M being an integer greater than one.

9. The receiver of the NFC device of claim 1, further comprising a demodulator configured to demodulate output signals of the first and second channels.

10. A method of setting a reference voltage of a receiver of a Near Field Communication reader, comprising:

using a near field communication device as in claim 1 for:

monitoring an output of a comparator of the receiver of the Near Field Communication reader during an iteration of a time interval in which the Near Field Communication reader is configured in a mode to set the reference voltage to be used in an operating mode, the reference voltage applied to the comparator; and setting the reference voltage to be used in the operating mode in response to the output being constant during the iteration of the time interval.

11. The method of claim 10, wherein the time interval is a number of cycles of a clock and, wherein the setting the reference voltage includes increasing a value of the reference voltage applied to the comparator.

12. The method of claim 10, further comprising:

changing a value of the reference voltage applied to the comparator in response to a change in the output during the iteration of the time interval; and repeating the monitoring and the setting.

13. The method of claim 12, wherein the changing is increasing the value of the reference voltage applied to the comparator.

14. The method of claim 10, wherein the iteration is a plurality of iterations and the setting the reference voltage includes determining an average value of the reference voltage applied to the comparator during the plurality of iterations of the time interval.

15. A near field communication (NFC) device, comprising:

a resonance unit configured to radiate, in a normal mode, an electro-magnetic wave to exchange data with an external NFC card; and an NFC chip including a receiver configured to receive an input signal, wherein the receiver comprises:

a local oscillator configured to generate a first local oscillating signal;

a first channel configured to process the input signal by mixing the input signal with the first local oscillating signal; and a second channel configured to process the input signal by mixing the input signal with a second local oscillating signal that has a phase difference of 90 degrees with respect to the first local oscillating signal, wherein each of the first and second channels comprises a comparator unit that includes the comparator configured to compare, in a comparator mode, an amplifier output signal with a reference voltage whose level increases in a step-wise manner and the comparator unit is configured to set a level of the reference voltage to be used in the normal mode based on an output signal of the comparator, wherein the first channel comprises:

a first mixer configured to mix the input signal with the first local oscillating signal to generate a first mixed signal;

a first low-pass filter configured to filter the first mixed signal;

a first variable gain amplifier configured to amplify an output of the first low-pass filter to provide a first amplifier output signal; and a first comparator unit that includes a first comparator configured to compare, in the comparator mode, the first amplifier output signal with a first reference voltage whose level increase in the step-wise manner, wherein the first comparator unit comprises:

a programmable counter configured to perform, in the comparator mode, an up-counting operation to generate a counting value;

a step reference voltage generator configured to generate, in the comparator mode, the first reference voltage whose level increases in the step-wise manner in response to the counting value;

the first comparator configured to compare, in the comparator mode, the first amplifier output signal with the first reference voltage to provide a first comparator output signal; and a reference voltage setting unit configured to detect, in the comparator mode, a level of the first comparator output signal and configured to determine a level of the first reference voltage to be used in the normal mode based on the first comparator output signal whose level is not changed during M times, M being an integer greater than one.

16. The NFC device claim 15, wherein the NFC device is an NFC reader.

17. The NFC device of claim 15, wherein the second channel comprises:

a phase shifter configured to shift a phase of the first local oscillating signal to generate the second local oscillating signal;

a second mixer configured to mix the input signal with the second local oscillating signal to generate a second mixed signal;

a second low-pass filter configured to filter the second mixed signal;

a second variable gain amplifier configured to amplify an output of the second first low-pass filter to provide a second amplifier output signal; and a second comparator unit that includes a second comparator configured to compare, in the comparator mode, the second amplifier output signal with a second reference voltage whose level increases in the step-wise manner.

18. The NFC device of claim 17, wherein the second comparator unit comprises:

a programmable counter configured to perform, in the comparator mode, an up-counting operation to generate a counting value;

a step reference voltage generator configured to generate, in the comparator mode, the second reference voltage whose level increases in the step-wise manner in response to the counting value;

the second comparator configured to compare, in the comparator mode, the second amplifier output signal with the second reference voltage to provide a second comparator output signal; and a reference voltage setting unit configured to detect, in the comparator mode, a level of the second comparator output signal and configured to determine a level of the second reference voltage to be used in the normal mode based on the second comparator output signal whose level is not changed during M times, M being an integer greater than one.

19. A receiver of a near field communication (NFC) device, the receiver comprising:
- a local oscillator configured to generate a first local oscillating signal;
- a first channel configured to process an input signal by mixing the input signal with the first local oscillating signal; and
- a second channel configured to process the input signal by mixing the input signal with a second local oscillating signal that has a phase difference of 90 degrees with respect to the first local oscillating signal,
- wherein each of the first and second channels comprises a comparator unit that includes a comparator configured to compare, in a comparator mode, an amplifier output signal with a reference voltage whose level increases in a step-wise manner and the comparator unit is configured to set a level of the reference voltage to be used in a normal mode based on an output signal of the comparator,
- wherein the second channel comprises:
- a phase shifter configured to shift a phase of the first local oscillating signal to generate the second local oscillating signal;
- a second mixer configured to mix the input signal with the second local oscillating signal to generate a second mixed signal;
- a second low-pass filter configured to filter the second mixed signal;
- a second variable gain amplifier configured to amplify an output of the second low-pass filter to provide a second amplifier output signal; and
- a second comparator unit that includes a second comparator configured to compare, in the comparator mode, the second amplifier output signal with a second reference voltage whose level increases in the step-wise manner wherein the second comparator unit comprises:
- a programmable counter configured to perform, in the comparator mode, an up-counting operation to generate a counting value;
- a step reference voltage generator configured to generate, in the comparator mode, the second reference voltage whose level increases in the step-wise manner in response to the counting value;
- the second comparator configured to compare, in the comparator mode, the second amplifier output signal with the second reference voltage to provide a second comparator output signal; and
- a reference voltage setting unit configured to detect, in the comparator mode, a level of the second comparator output signal and configured to determine a level of the second reference voltage to be used in the normal mode based on the second comparator output signal whose level is not changed during M times, M being an integer greater than one.

20. The receiver of the NFC device of claim 19, further comprising:
- a demodulator configured to demodulate output signals of the first and second channels.

* * * * *